(12) United States Patent
Kautzsch et al.

(10) Patent No.: US 10,580,663 B2
(45) Date of Patent: Mar. 3, 2020

(54) MICROELECTROMECHANICAL DEVICE AND METHOD FOR FORMING A MICROELECTROMECHANICAL DEVICE HAVING A SUPPORT STRUCTURE HOLDING A LAMELLA STRUCTURE

(71) Applicant: Infineon Technologies Dresden GmbH, Dresden (DE)

(72) Inventors: Thoralf Kautzsch, Dresden (DE); Steffen Bieselt, Stadt Wehlen (DE); Alessia Scire, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 3 days.

(21) Appl. No.: 15/695,088

(22) Filed: Sep. 5, 2017

(65) Prior Publication Data
US 2018/0065846 A1 Mar. 8, 2018

(30) Foreign Application Priority Data
Sep. 7, 2016 (DE) .................. 10 2016 217 001

(51) Int. Cl.
*B81B 3/00* (2006.01)
*B81C 1/00* (2006.01)
*H01L 21/48* (2006.01)

(52) U.S. Cl.
CPC ............ *H01L 21/48* (2013.01); *B81B 3/0086* (2013.01); *B81C 1/00182* (2013.01)

(58) Field of Classification Search
CPC .... H01L 21/48; B81C 1/00182; B81B 3/0086
See application file for complete search history.

(56) References Cited

U.S. PATENT DOCUMENTS

| | | | |
|---|---|---|---|
| 6,433,401 B1 * | 8/2002 | Clark | B81C 1/00246 257/510 |
| 2005/0074946 A1 * | 4/2005 | Chu | H01L 21/76224 438/424 |

(Continued)

FOREIGN PATENT DOCUMENTS

| DE | 102012022829 A1 | 5/2013 |
|---|---|---|
| DE | 102014117969 A1 | 6/2015 |

OTHER PUBLICATIONS

German Patent Office, Office Action issued for DE 102016217001.5, 6 pgs., dated May 3, 2017.

*Primary Examiner* — Steven H Loke
*Assistant Examiner* — Juanita B Rhodes
(74) *Attorney, Agent, or Firm* — Schiff Hardin LLP (57) ABSTRACT

A method for forming a microelectromechanical device is shown. The method comprises forming a cavity in a semiconductor substrate material, wherein the semiconductor substrate material comprises an opening for providing access to the cavity through a main surface area of the semiconductor substrate material. In a further step, the method comprises forming a support structure having a support structure material different from the semiconductor substrate material to close the opening at least partially by mechanically connecting the main surface area of the semiconductor substrate material with the bottom of the cavity. Furthermore, the method comprises a step of forming a lamella structure in the main surface area above the cavity such that the lamella structure is held spaced apart from the bottom of the cavity by the support structure.

17 Claims, 6 Drawing Sheets

(56) References Cited

U.S. PATENT DOCUMENTS

2015/0162253 A1* 6/2015 Bieselt .................... B23Q 3/18
174/251
2016/0093468 A1* 3/2016 Lang .................... H01J 37/304
216/59

* cited by examiner

FIG 2a — X-section post trench etch

FIG 2b — Top view post H2 annealing

FIG 2c — X-section post H2 annealing

1. SON with local opening

FIG 5b

2. SON with oxide plug

FIG 5c

2. SON with second trench

FIG 5d

2. SON with local isolation

MICROELECTROMECHANICAL DEVICE AND METHOD FOR FORMING A MICROELECTROMECHANICAL DEVICE HAVING A SUPPORT STRUCTURE HOLDING A LAMELLA STRUCTURE

CROSS-REFERENCE TO RELATED APPLICATIONS

The present application claims foreign priority to German application no. 102016217001.5, filed on Sep. 7, 2016.

Embodiments relate to a method for forming a microelectromechanical device and the respective microelectromechanical device. Further embodiments relate to a design and a method for forming an isolated plate structure.

Thermally or electrically isolated ultrathin silicon films are desired for numerous electronic applications. Thermal isolation is a key for micro machined infrared emitters as used in gas sensors or micro heaters. A heater structure should be placed in an air or vacuum environment with minimum coupling to solid material with high thermal conductance. In this way, the ratio of infrared radiation to thermal conductance can be kept high for maximum radiation efficiency.

Electrical isolation of defined chip regions is beneficial for a broad range of electronic applications. Especially for micro electro mechanical systems (MEMS), the ability to electrically separate certain elements of the device in a simple way is a main demand. The standard procedure for fabrication of a locally isolated or free hanging silicon element is based on use of SOI (silicon on insulator) material. A buried oxide layer provides an electric barrier to the underlying substrate wafer. In some applications, the oxide layer of a SOI wafer is used as a sacrificial layer. By wet chemical etching, parts of the layer are removed in order to provide local cavities. Such a procedure has been used for the fabrication of MEMS resonators. One main problem when using SOI material is the cost of approx. 200 US$ per wafer. Another disadvantage is an elaborate fabrication process.

Therefore, there is a need for an improved approach.

It is an object of the present disclosure to provide an improved concept to build microelectromechanical devices. This object is solved by the subject matter of the independent claims.

Embodiments are based on the finding that displaceable parts, such as a membrane, of a microelectromechanical device may be connected to the semiconductor substrate only by one or more support structures such as a pole, stick, or beam of for example an insulating material. The pole may be formed by an (epitaxial) growth of the support structure material from the bottom of the cavity into an opening of the membrane. Therefore, the support structure material may be inserted into the cavity through the hole, which is (partially) closed by the support structure material at the end of the growing of the pole. Since the future membrane or displaceable element of the micromechanical device is still directly mechanically connected to the future base structure, i.e. the membrane is not yet insulated from the base structure, a trench surrounding the pole is formed to spatially separate the membrane from the semiconductor substrate. Therefore, at least if the poles provide an electrical and thermal insulation, the membrane is electrically and thermally isolated from the semiconductor substrate since the pole or, according to embodiments, multiple poles form the only connection between the membrane and the semiconductor substrate.

Embodiments show a method for forming a microelectromechanical device. The method comprises forming a cavity in a semiconductor substrate material, wherein the semiconductor substrate material comprises an opening for providing access to the cavity through a main surface area of the semiconductor substrate material. In a further step, the method comprises forming a support structure having a support structure material different from the semiconductor substrate material to close the opening at least partially by mechanically connecting the main surface area of the semiconductor substrate material with the bottom of the cavity. Furthermore, the method comprises a step of forming a lamella structure in the main surface area above the cavity such that the lamella structure is held spaced apart from the bottom of the cavity by the support structure.

According to further embodiments, the forming of the support structure comprises depositing the support structure material from the bottom of the cavity to the main surface area of the semiconductor substrate material. Moreover, the support structure material may comprise an isolating material, such that the lamella structure may be electrically and thermally isolated from the semiconductor substrate material. To grow the support structure from the bottom of the cavity of the main surface area of the semiconductor substrate material, the forming of the support structure may comprise a high density plasma oxide deposition process to deposit the support structure material.

According to further embodiments, the forming of the cavity comprises a silicon-on-nothing or a Venezia process comprising forming small-scale openings in the semiconductor substrate, connecting the openings at the bottom of the small-scale openings to form the cavity, and closing the small-scale openings above the cavity. Furthermore, the forming of the opening forms the opening with a greater size than the small-scale openings in the semiconductor substrate during the silicon-on-nothing process or the Venezia process, such that the opening remains open when the small-scale openings are closed.

Further embodiments show a microelectromechanical device comprising a semiconductor substrate material. The semiconductor substrate material comprising a cavity, wherein the cavity is at least partially covered by a main surface area of the semiconductor substrate material. The microelectromechanical device may further comprise a support structure of a support structure material different from the semiconductor substrate material to mechanically connect the main surface area of the semiconductor substrate material with the bottom of a cavity. Furthermore, the microelectromechanical device comprises a lamella structure in the main surface area above the cavity such that the lamella structure is held spaced apart from the bottom of the cavity by the support structure. In other words, a projection of the lamella structure perpendicular to the main surface or a footprint of the lamella structure falls completely within the cavity.

DRAWINGS

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference number are mutually exchangeable.

Embodiments of the present invention will be discussed subsequently, referring to the enclosed drawings, wherein:

FIG. 3d is a schematic top view, wherein the left image of FIG. 3d illustrates the intermediate microelectromechanical device of FIG. 3a or FIG. 3b and wherein the right image of FIG. 3d illustrates the intermediate microelectromechanical device of FIG. 3c or FIG. 3e;

In the following, embodiments of the invention will be described in further detail. Elements shown in the respective figures having the same or a similar functionality will have associated therewith the same reference signs.

DETAILED DESCRIPTION

Figure 1:
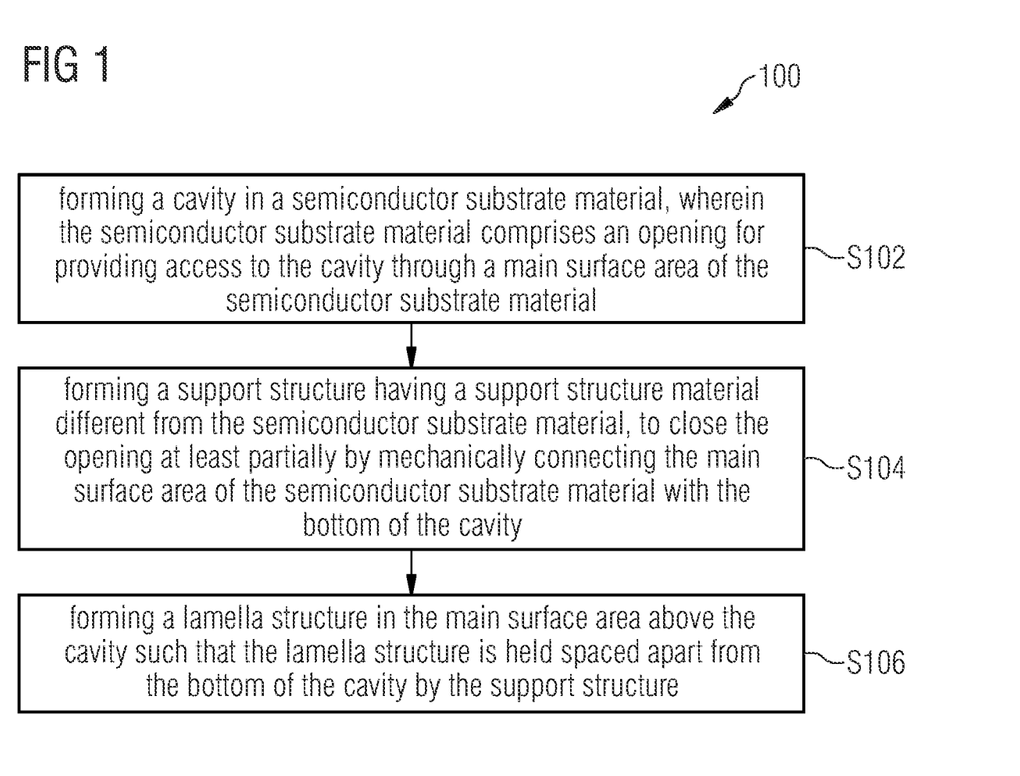
FIG. 1 shows a schematic block diagram of a method for forming a microelectromechanical device.

FIG. 1 shows a schematic block diagram of a method 100 for forming a microelectromechanical device. The method 100 comprises a step S102 of forming a cavity in a semiconductor substrate, a step S104 of forming a support structure and a step S106 of forming a lamella structure.

The step S102 comprises forming the cavity in a semiconductor substrate material, wherein the semiconductor substrate material comprises an opening for providing access to the cavity through a main surface area of the semiconductor substrate material. The forming of the cavity may be performed by a silicon-on-nothing process or a Venezia process having, after the final annealing, the opening remaining as a connection into the cavity. The opening may be a hole, also referred to as trench.

The step S104 further comprises forming the support structure having a support structure material different from the semiconductor substrate material, to close the opening at least partially by mechanically connecting the main surface area of the semiconductor substrate material with the bottom of the cavity. The support structure material may be deposited from the bottom of the cavity by a suitable deposition process.

Moreover, the step S106 comprises forming the lamella structure in the main surface area above the cavity such that the lamella structure is held spaced apart from the bottom of the cavity by the support structure. In other words, a projection of the lamella structure 14 perpendicular to the main surface 8 or a footprint of the lamella structure 14 falls completely within the cavity 16. The aforementioned steps will be described more detailed with respect to the following figures.

Figure 2A:
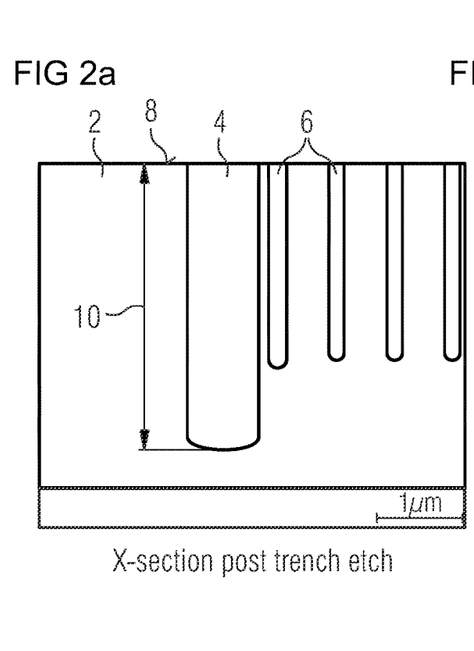
FIG. 2a shows a schematic cross-sectional view of an intermediate microelectromechanical device or the semiconductor substrate material according to embodiments after openings or trenches are formed in the semiconductor substrate material, for example as one step in a silicon-on-nothing or Venezia process.

FIG. 2a shows a schematic cross-sectional view of the semiconductor substrate material 2 revealing the opening 4 and small-scale openings 6. The opening 4 and the small-scale openings 6 may be formed as part of a silicon-on-nothing process or a Venezia process. The small-scale opening 6 and the future opening 4 may be formed, e.g. etched, into the semiconductor substrate material from a main surface area 8. A penetration depth or a length 10 of the opening 4, measured e.g. perpendicular to the main surface area 8, may be between 100 nm to 10 µm, between 1 µm and 7 µm or between 2 µm and 4 µm, as for example 3 µm. As shown in FIG. 2a, the length 10 of the opening 4 may be greater than the length of the small-scale openings 6, that may be measured parallel to the length of the opening 4. Furthermore, a diameter or size of the opening at the main surface area 8 is greater than the respective diameter or size of the small scale openings. The different sizes of the openings (opening 4 and small-scale openings 6) may be derived by applying a respectively patterned mask material for example by applying a greater distance column to the photo resist. The openings may be formed as, oval or circular trenches or holes, wherein roundings or curves of the oval or circular holes may be cut such that a (top-view) shape of the openings comprises e.g. a hexagon structure or any other polygon.

Figure 2B:
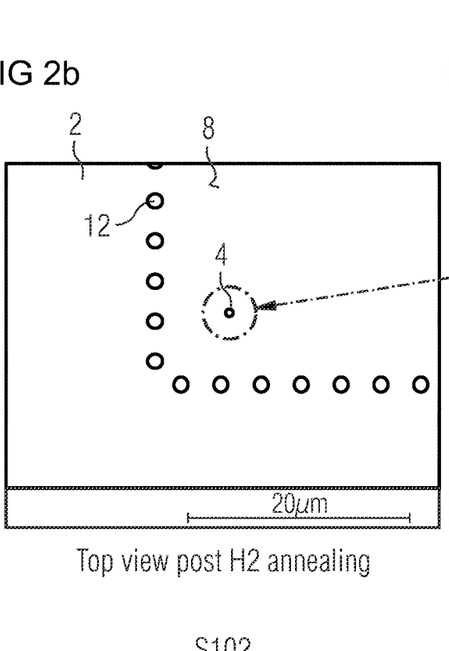
FIG. 2b shows a schematic top view of an intermediate microelectromechanical device or the semiconductor substrate material according to embodiments after annealing, for example as performed in a further step during the silicon-on-nothing processor the Venezia process.

FIG. 2b shows the semiconductor substrate material 2 from a top view after the small-scale openings 6 are closed during an annealing process. The opening 4 is still visible in the top view and therefore the cavity 16 (cf. FIG. 2c) below the main surface area 8 is accessible through the opening 4. Note that the further holes 12 are only for illustrative purpose in order to more easily locate the location of the hole 4.

Figure 2C:
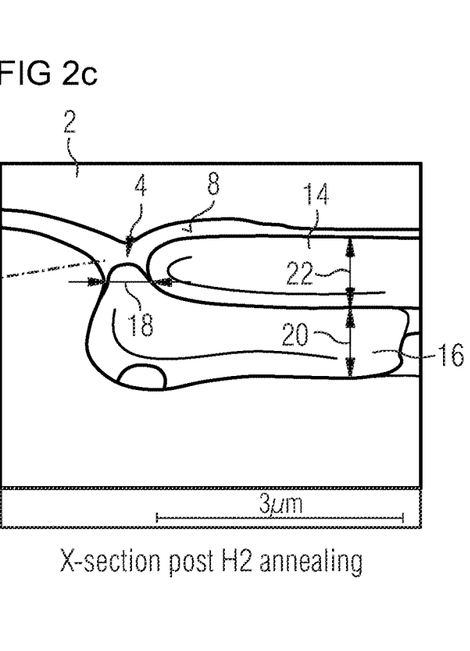
FIG. 2c shows a schematic cross-sectional view of the intermediate microelectromechanical device or the semiconductor substrate material of FIG. 2b at the same processing step.

FIG. 2c shows a schematic cross-sectional view of the semiconductor material 2 in the same processing step as already described with respect to FIG. 2b after the hole 4 and the cavity 16 are formed. Following, the actual support structure formed in the hole 4 and a circumferential trench separating the lamella structure 14 from the remaining semiconductor substrate 2 are described.

A size or diameter 18 of the opening 4 at the main surface area 8 may be between 100 nm and 1 µm, between 250 nm and 750 nm or between 450 nm and 600 nm, such as for example 500 nm. Furthermore, a height 20 of the cavity 16, such as for example a mean value of the height of the cavity 16 measured from the bottom of the cavity to the bottom of the lamella structure perpendicular to the main surface area 8, may be between 100 nm and 2 µm, between 300 nm an 1.5 µm or between 500 nm and 1 µm, such as for example 800 nm. The height 22 of the lamella structure 14, such as for example a mean of the height of the lamella structure above the cavity 16 measured perpendicular to the main surface area 8, may also be in the range of 100 nm and 2 µm, between 250 nm and 1.5 µm, and between 500 nm and 1 µm, such as e.g. 800 nm.

Figure 3A:
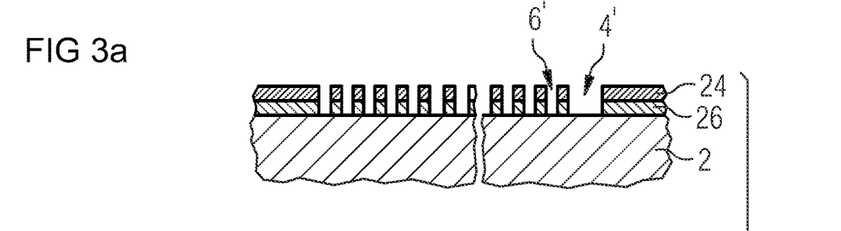
FIGS. 3a-f schematically show the intermediate microelectromechanical device or the semiconductor substrate according to different embodiments at different processing steps, wherein FIGS. 3a,b,c,e,f are schematic cross-sectional views
Figure 3B:
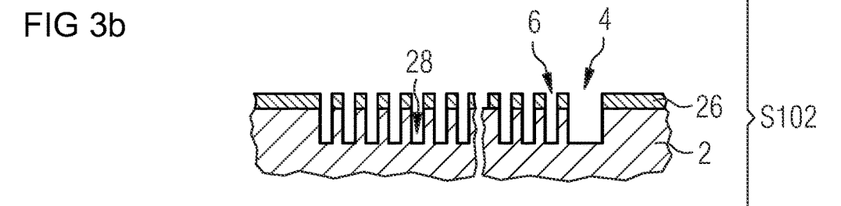
Figure 3C:
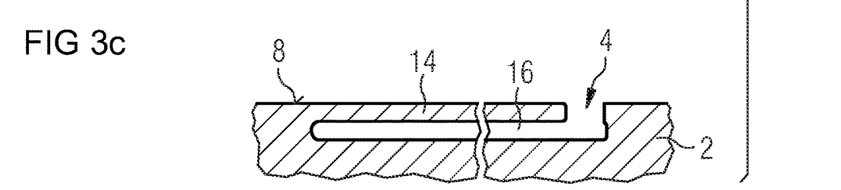

FIGS. 3a to 3c show cross-sectional views of the semiconductor substrate material 2 at three different manufacturing steps during forming the cavity 16 in the semiconductor substrate. Thus, the steps of FIG. 3a to FIG. 3c may be performed during step S102 of forming the cavity 16 in the semiconductor substrate material 2. FIG. 3a shows a photoresist pattern 24 and a mask material 26 on the semiconductor substrate material 2. The semiconductor substrate material may comprise silicon or germanium or any other suitable semiconductor material. The photoresist pattern 24, and therefore also the mask 26, show openings or patterns 4', 6' to form the opening 4 and the small-scale openings 6, respectively, into the semiconductor substrate material 2.

FIG. 3b shows the semiconductor substrate material 2 and the mask material 26, wherein the opening 4 and the small-scale openings 6 have been formed using the pattern of the mask material 26, for example through an isotropic etching process such as (deep) reactive ion etching ((D)RIE). Since the mask 26 already comprises patterns for both the opening and the small-scale openings, both etching processes may be performed simultaneously using the same etching process.

FIG. 3c shows the mask material 26 being removed and the small-scale openings 6 being closed in an area adjacent to the main surface area 8 of the semiconductor material 2, wherein furthermore the cavity 16 is formed at the bottom of the small-scale openings spaced apart from the main surface area 8. In other words, the trenches 6 are changed to one unclosed (or unsealed) empty space 16 having a flat spatial region and an opening space on the semiconductor substrate by performing high-temperature annealing, for example in a pressure-reduced non-oxidizing atmosphere such as a 100% hydrogen atmosphere at 1100° C. and 10 Torr. This process may be referred to as a silicon-on-nothing process or Venezia process. Using this silicon-on-nothing process, a spherical empty space is formed at the bottom of each trench 6 extending into the neighboring spherical empty space and therefore forming a flat empty cavity 16 below the lamella structure 14. However, since a diameter of the opening 4 is greater than the diameter of the small-scale opening 6, there is not sufficient semiconductor substrate material to close the opening 4, such that the opening 4 remains open after the annealing and therefore still provides access to the cavity 16 after annealing.

Figure 3D:
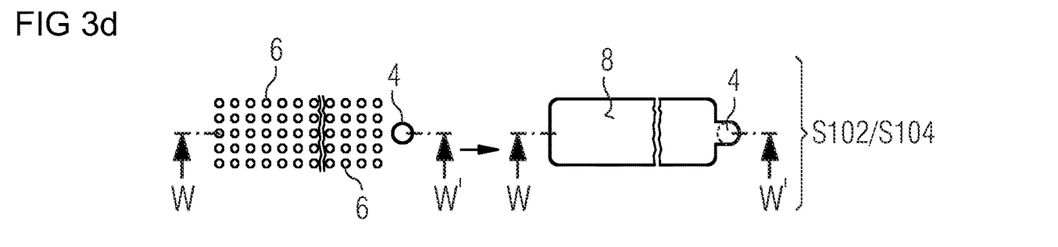

The drawing on the left of FIG. 3d shows a layout of the trenches 4 and 6 in a top view corresponding to the cross-sectional views of FIG. 3a and FIG. 3b. Furthermore, the right illustration of FIG. 3d shows a top view of the semiconductor substrate material after annealing corresponding to the cross-sectional view of FIG. 3c or FIG. 3e (one would not be able to differentiate between the opening 4 or the filled opening, i.e. the support structure). Even though the opening 4 is located at the border or the peripheral of the cavity 16, the location of the opening 4 is not restricted to the position as illustrated.

In other words, the silicon-on-nothing process may also be referred to as an empty space in silicon (ESS) process. A similar or equal process is the Venetia or Venezia process, which was developed (nearly) at the same time. Both processes may be similar, although they may differ in details. However, the Venezia process and the silicon-on-nothing process are mutually applicable. Based on regular silicon wafers, a plurality of trenches may be formed or opened. The trenches may be oxidized after an epitaxial growth. The etching step may be executed selectively or may be extended to all surfaces of a later chip. Oxidized buried channels and cavities which may be obtained inside the monocrystalline silicon allow for a manufacturing of cheap substrates. After having formed the trenches, for example, by applying temperatures of, e.g., more than 1000° C., more than 1100° C. or more than 1200° C. and while applying a hydrogen material, the silicon material may recombine such that the cavity is formed inside the semiconductor substrate. The recombination may comprise an epitaxial growth and/or a doping of the material that recombines. A portion of the semiconductor substrate covering the cavity and being arranged between the cavity and the main surface may form the support structure. Thus, using the silicon-on-nothing technology, a trench field in a (standard) semiconductor substrate is processed in a reflow procedure to generate local cavities, sealed with single crystalline silicon.

In other words, the forming of the cavity in step S102 may comprise a silicon-on-nothing process or a Venezia process comprising forming small-scale openings 6 in the semiconductor substrate material 2, connecting the small-scale openings at the bottom 28 of the small-scale openings to form the cavity 16. The step S102 may further comprise closing the small-scale openings above the cavity 16 to form the (future) lamella structure. According to further embodiments, step S102 may further comprise forming the opening 4 with a greater size than the small-scale openings 6 in the semiconductor substrate material 2 during the silicon-on-nothing process or the Venezia process, wherein the opening 4 remains open when the small-scale openings 6 are closed during the annealing process. The annealing may be performed in a hydrogen ambient with a reflow at e.g. 1100° C., 10 Torr and for example a duration of e.g. 30 minutes.

Figure 3E:
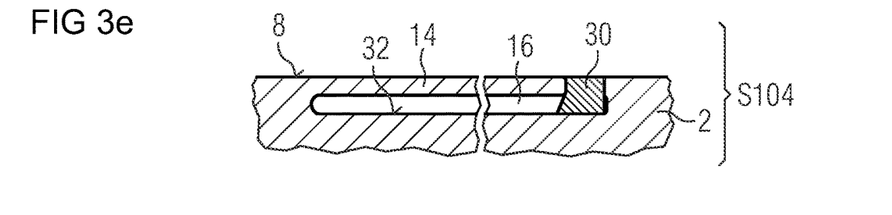
Figure 3F:
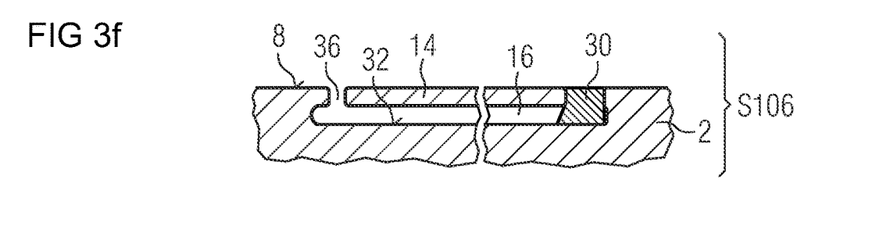

FIG. 3e shows the step S104 according to embodiments. Thus, after the cavity 16 is formed using the silicon-on-nothing process or the Venezia process is completed, the support structure 30 may be formed in the remaining opening 4. In this intermediate step, at least if no further openings 4 are formed and remain open, i.e. no support structure is formed in the further openings, the cavity 16 is hermetically sealed. The cross-sectional view of FIG. 3e shows that the support structure 30 connects the bottom 32 of the cavity 16 mechanically to the main surface area 8 of the semiconductor substrate material 8. It has to be noted that the main surface area of the semiconductor substrate is the same as when referred to the main surface area of the lamella 14. Furthermore, the main surface area of the semiconductor substrate is referred to as the main surface area of the semiconductor substrate where the main processing steps are performed. Additionally, it may be noted that the support structure 30 should connect the bottom 32 of the cavity 16 with the future lamella structure 14 in order to sufficiently support the lamella structure such that the same is spaced apart from the bottom 32 of the cavity 16.

According to embodiments, the forming of the support structure in step S104 may comprise depositing or growing the support structure material from the bottom 32 of the cavity 16 to the main surface area 8 of the semiconductor substrate material 2. Therefore, the support structure material may comprise an isolating material, such as for example an oxide or a nitride.

According to embodiments, the forming of the support structure 30 in step S104 may comprise a high density plasma oxide deposition process to deposit the support structure material. In other words, forming the support structure 30 uses a high density plasma oxide deposition (HDP) to (epitaxially) grow the support structure 30 layer-wise from the bottom of the cavity 32 until at least the bottom or underneath of the future lamella structure 14 facing the cavity 16 is reached. Therefore, this processing may be referred to as a bottom-to-top filling of the opening 4.

According to further embodiments, the forming of the support structure in step S104 may further comprise at least partially closing the opening 4 such that at least a part of the cavity 16 remains in the semiconductor substrate material 2 below the future lamella structure 14. In other words, the cavity 16 is not supposed to be completely filled by an isolating material or any further non-gaseous (e.g. at standard conditions for temperature and pressure) material such that the future lamella structure 14 is able to move or to be displaceable with respect to the semiconductor material 2.

Using the processing option shown in FIG. 3 a thermal and/or electrical isolation in local areas may be obtained. It has to be noted that the cavity is not (completely) filled by, for example, an isolating material, but it remains open such that the above lamella structures such as a membrane is displaceable or movable with respect to the bottom of the cavity.

Figure 4A:
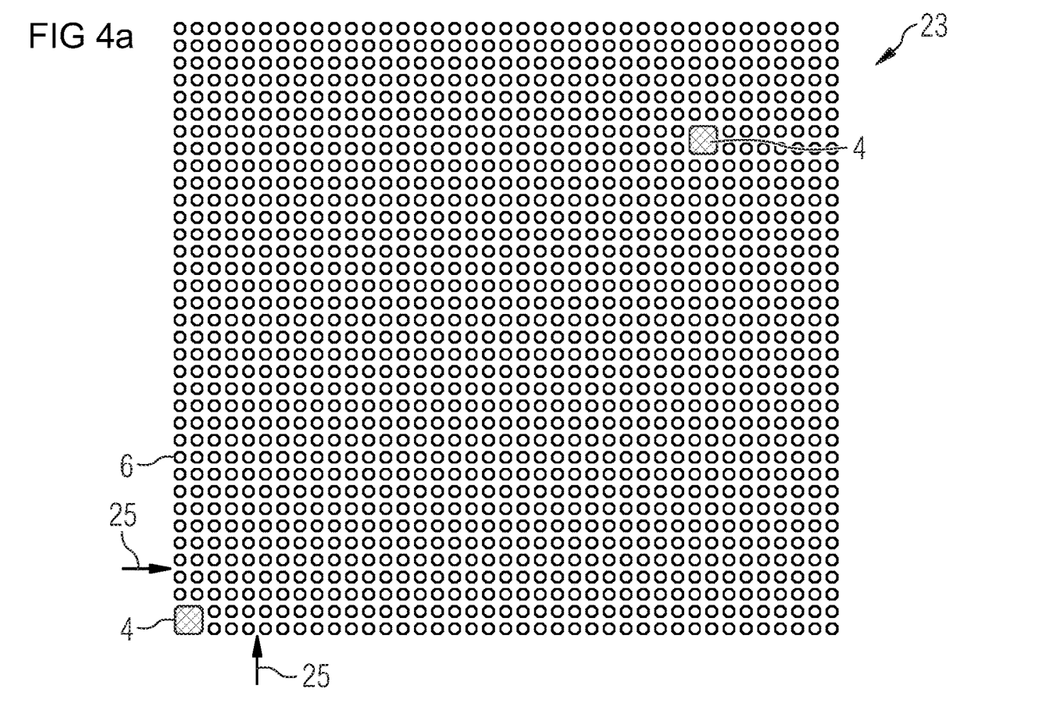
FIG. 4a shows a schematic mask used to form the opening and small-scale openings, e.g. as a step during the silicon-on-nothing process, according to embodiments.
Figure 4B:
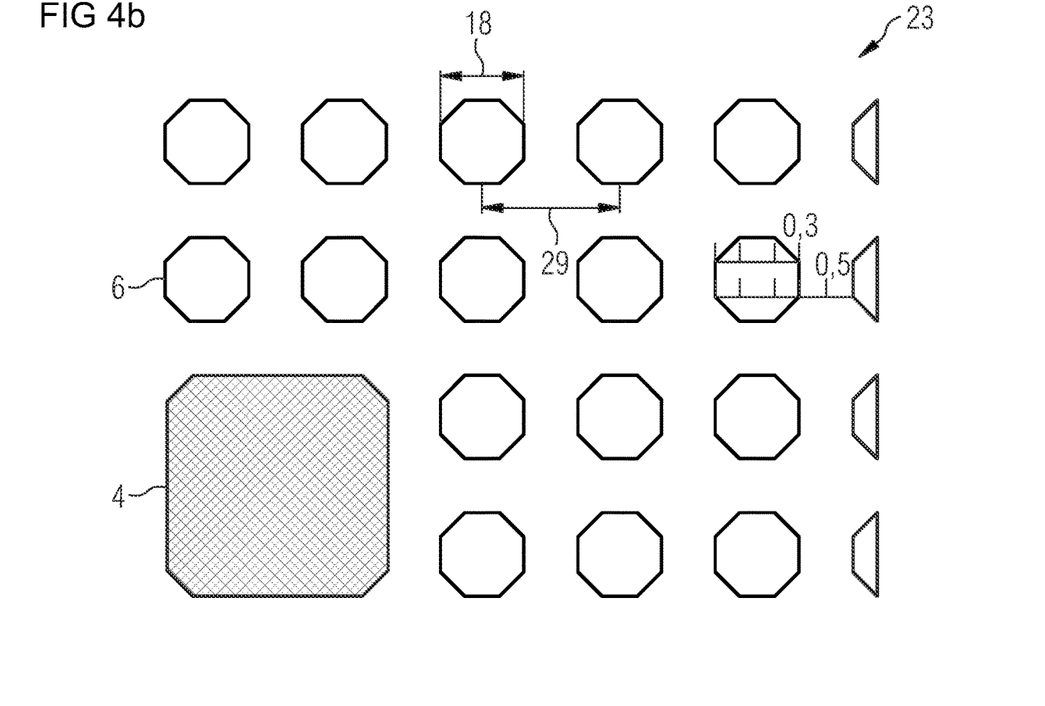
FIG. 4b shows a section of the mask of FIG. 4a in a more detailed view.

FIG. 4a and FIG. 4b show a respective mask as already similarly shown at the left of FIG. 3d. FIG. 4 indicates the openings 4 and the small scale openings 6. According to the embodiment of FIG. 4, an opening 4 comprises the a structural size of 4 small scale openings 6. However, different square sizes such as e.g. a structural size of 9 small scale openings or rectangular sizes such as e.g a structural size of 6, 8 or 12 small scale openings may also be used.

Furthermore, depending on the actual embodiments, it may be more advantageous to arrange the opening 4 spaced apart from the border 16, for example by providing, when referring to FIG. 3d, further small-scale openings 6 to the right of opening 4. This is indicated by the opening 4 at the top right of FIG. 4a. In this case, a trench separating the lamella structure from the semiconductor substrate material at the main surface area 8 completely severs or spaces apart the lamella structure 14 from the remaining semiconductor substrate material 2, i.e. the base structure. In the embodiment described with respect to FIG. 3, the support structure formed in the opening 4 provides a mechanical connection between the lamella structure 14 and the semiconductor substrate material 2 at the main surface area 8.

FIG. 4b shows a section of the mask 23 of FIG. 4a in a more detailed view. The section is taken from the bottom left corner of FIG. 4a being delimited by arrows 25 to the remaining mask. A typical structural size may comprise a grid of holes or trenches having a diameter 18 as described above of e.g. 300 nm and a pitch 29, i.e. a distance of the center (of gravity) of two adjacent holes of e.g. 500 nm. More generally, a pitch between 200 nm and 1 µm, between 350 nm and 750 nm or between 450 nm and 600 nm may be possible, wherein the pitch is greater than the diameter 18 of the holes.

Figure 4C:
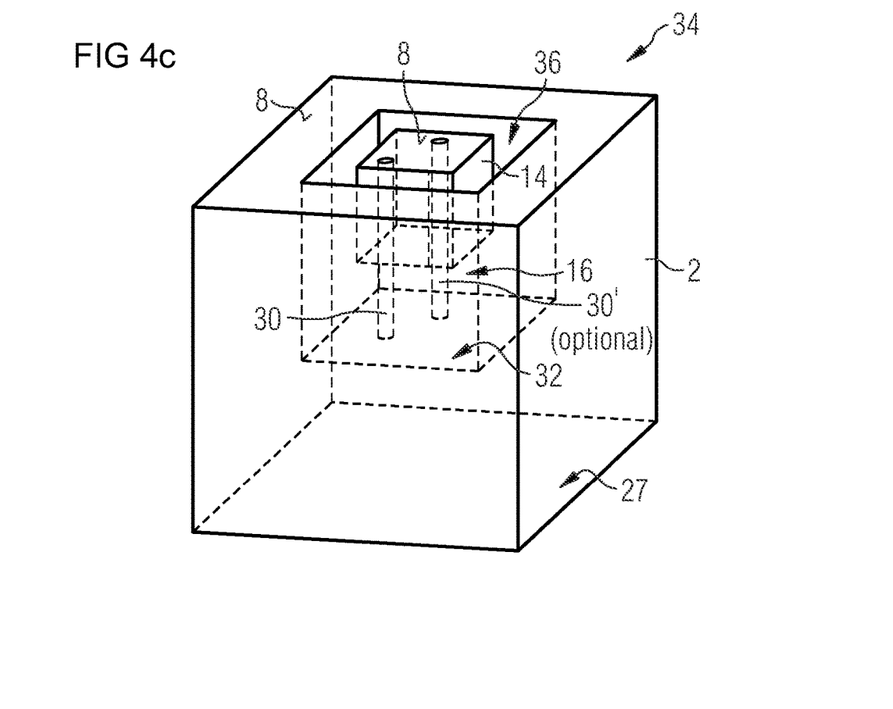
FIG. 4c shows a further support structure.

FIG. 4c shows a microelectromechanical device 34 according to an embodiment. The microelectromechanical device 34 comprises a semiconductor substrate material 2 having a cavity 16, wherein the cavity 16 is at least partially covered by a main surface area 8 of the semiconductor substrate material 2. The microelectromechanical device further comprises a support structure 30 of a support structure material different from the semiconductor substrate material to mechanically connect the main surface area 8 of the semiconductor substrate material with a bottom 32 of the cavity 16. Additionally, the microelectromechanical device 34 may comprise a lamella structure 14 in the main surface area of the semiconductor substrate above the cavity 16 such that the lamella structure 14 is held spaced apart from the bottom 32 of the cavity by the support structure 30. The support structure 30 may be connected to the support structure in a way that the support structure 30 is completely surrounded by the lamella structure 14 and such that the support structure connects the remaining semiconductor substrate material only at the bottom of the cavity. However, according to embodiments, the trench 4 may be filled with a material different from the semiconductor material 2, e.g. an isolating material such as an oxide. Thus, the surface 8 of the semiconductor substrate of the lamella and the remaining semiconductor substrate material are mechanically connected, the cavity 16 is sealed.

According to embodiments, the microelectromechanical device 34 may additionally comprise optional support structures 30' having the same properties as the support structure 30. Further support structures 30' may further stabilize the lamella structure in order to maintain a defined distance between the bottom of the cavity and the bottom of the lamella structure under normal conditions and such that a force impinging on the lamella structure may be accurately measured by determining a capacitive change between the lamella structure and the bottom of the cavity.

FIG. 4c further illustrates that in the step S106, the lamella structure may be formed by forming a circumferential trench 36 in the main surface area 8 of the semiconductor substrate material 2 into the cavity 16 after the support structure 13 is formed, wherein the circumferential trench 36 encloses the support structure 30 and wherein the circumferential trench separates the lamella structure 14 from the semiconductor substrate material at the main surface area 8. It has to be noted that, using the mask 23 as indicated in FIG. 4a, the opening 4 would be located in the trench 36, mechanically connecting the bottom 32, the remaining semiconductor substrate material 2, and the lamella structure 14. The remaining semiconductor substrate material may be referred to the semiconductor substrate material of the base structure 27, i.e. the semiconductor substrate material different from the semiconductor substrate material used to form the lamella structure.

In other words, the support structure 30 may be formed in the trench 4, wherein the trench 4 extends from the main surface area 8 of the semiconductor substrate material into the cavity 16. According to embodiments, the trench 36 is a circumferential trench having a closed shape. Due to the closed shape, the lamella structure is completely separated from the remaining semiconductor substrate material. The only connection between the lamella structure and the semiconductor substrate material may be formed by the support structure. Further embodiments show that the semiconductor substrate material comprises a trench extending from the main surface area of the semiconductor substrate material into the cavity, wherein the trench has a closed shape and wherein the circumferential trench encloses the support structure.

Additionally or alternatively, as indicated in FIG. 4c with respect to the further support structure 30', the support structure 30 may be completely surrounded by the lamella structure 14 such that the support structure 30 is not part of the circumferential trench 36 or such that the support 30 is spaced apart from the circumferential trench 36. However, this embodiment refers to the etching of circular or oval openings as described with respect to FIG. 3. In contrast to the embodiments of FIG. 3f where the support structure 30 is located at the border of the cavity and therefore within or inside the circumferential trench, the support structure 30' of FIG. 4c is located in the center of the lamella structure 14 or is at least enclosed by the lamella structure. To be more precise, the top of the support structure 30 at the main surface area is enclosed by the lamella structure. In a further (subsequent) trench etch process, the circumferential trench 36 is formed.

According to embodiments, the opening 4 is formed such that a cross-sectional area of the opening is smaller than 10%, smaller than 5% or smaller than 1% of a cross-sectional area of the cavity 16 measured in parallel to the main surface area 8. Thus, the cross-sectional area of the support structure 30 is also smaller than 10% of the main surface area of the lamella structure.

Embodiments show a structure that is thermally and electrically isolated from its surroundings. The structure may be fabricated with minimum effort by mainly using two trench etch sequences. It starts with the sequence shown in FIG. 3a-d. The result is a cavity underneath a, for example, 1 micron thick silicon sheet with an opening of approximately 1 μm or smaller. Instead of using a completely filled cavity, plugs (piles, support structure) of oxide or another insulating material are used to support the silicon sheet (i.e. lamella structure) during a subsequent trench etch process (forming e.g. the circumferential trench 36). An optional second fill process closes the circumferential trench and, if desired, evacuates the cavity. An evacuation of the cavity may be performed if, for example, residuals of one of the etching processes remain in the cavity. The second fill process may close the circumferential trench, which is however optional since the trench may also remain open. This depends on the further usage of the microelectromechanical device.

In other words, after the step (S104) of forming the support structure, the cavity 16 may be (hermetically) sealed, i.e. completely surrounded by the semiconductor substrate material 2. Thus, subsequent processing steps including further deposition steps may be performed without having deposition material being deposited in the cavity. A further evacuation of the cavity is omitted. Furthermore, due to the sealing, the further deposition process have a plane main surface area 8 to be deposited on without any holes that may negatively influence the accuracy of the further deposition process. However, after the further deposition steps are performed, the forming (S106) of the lamella structure may be conducted using e.g. etching of the circumferential trench.

Figure 5A:
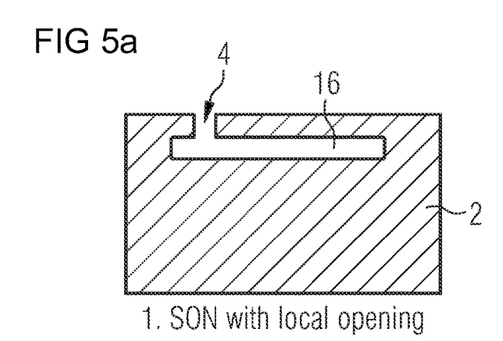
FIG. 5a-d show schematic cross-sectional views of intermediate microelectromechanical devices or the semiconductor substrate material at different processing steps according to embodiments.
Figure 5B:
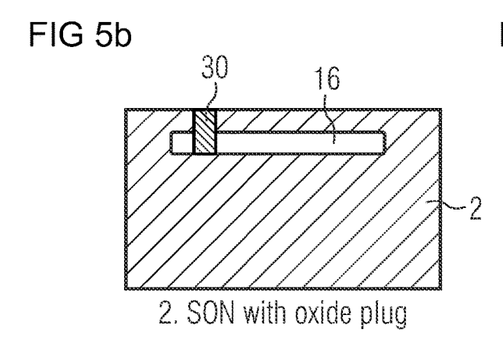
Figure 5C:
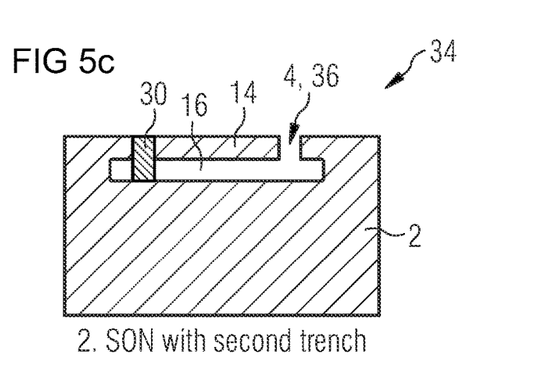
Figure 5D:
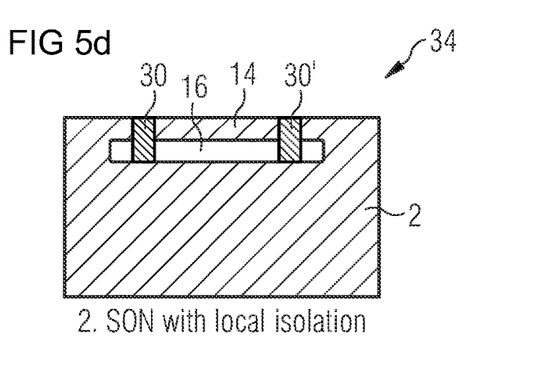

FIGS. 5a-d further show schematic cross-sectional views of intermediate microelectromechanical devices indicating the processing steps for forming the microelectromechanical device 34 at different processing steps. According to a first set of embodiments, FIGS. 5a-5d may be seen a sequence of processing steps, where FIG. 5a indicates a first processing step and FIG. 5d indicates the microelectromechanical device 34 after the fourth and last processing step indicated in FIG. 5. Therefore, FIG. 5a indicates the semiconductor substrate material 2 having the cavity 16 and the opening 4, for example after the silicon-on-nothing or Venezia process was performed. FIG. 5b indicates the semiconductor substrate material 2 of FIG. 5a, wherein the opening 4 is closed by the support structure 30. In a further processing step as indicated in FIG. 5c, a further opening 4 may be etched in the semiconductor substrate material 2 enabling, in a fourth processing step as indicated in FIG. 5d, to fill the further opening 4 by a further support structure material to form the further support structure 30'. However, in a further processing step and not indicated in FIG. 5 a circumferential trench should be formed separating the lamella structure 14 from the semiconductor substrate material 2.

However, according to further embodiments, FIG. 5c may be the resulting microelectromechanical device 34, if instead of a further opening 4, the circumferential trench 36 is etched in the semiconductor substrate material 2 separating the lamella structure 14 from the remaining semiconductor substrate material 2. In this case, the lamella structure 14 may only be supported by the single support structure 30. The processing shown in FIG. 5d would be obsolete.

However, according to further embodiments, the circumferential trench 36 may be completely filled by the further support structure 30' such that the lamella structure 14 is completely enclosed by support structure material used to form the support structure 30 and the further support structure 30'. According to these embodiments, the thermal and electrical isolation is only performed by the support structures 30 and 30', wherein in other embodiments the spacing between the lamella structures and the remaining semiconductor substrate material 2 (i.e. a residual structure) contributes to the electrical and thermal isolation. Embodiments using a lamella structure 14 completely surrounded by the support structure 30 and the further support structure 30' may, without a separate housing, enable a hermetic sealing of the cavity 16 such that, during the manufacturing process, a defined gas quantity (or a defined number of gas molecules) may be provided in the cavity and, due to the hermetical sealing, not substantially change during the lifetime of the microelectromechanical device 34 since no further gas molecules may enter the cavity 16 and no enclosed gas molecules may leave the cavity 16 (except of a small amount of diffusing atoms).

FIG. 6 shows schematic top views of embodiments of the present disclosure. FIG. 6a shows a top view of a microelectromechanical device having four support structures 30 in the lamella structure 14 which are all enclosed by (one single) circumferential trench 36. The support structures 30 are arranged in the corners of the circumferential trench 36, however, spatially separated from the circumferential trench. The circumferential trench or second trench 36 may be etched after the support structures 30 are formed. The support structures 30 may be formed during one processing step, if the manufacturing of the cavity 16 remains for respective openings in the main surface are of the semiconductor substrate material. However, after forming the cavity only one opening in the main surface area 8 of the semiconductor substrate material or the future lamella structure 14 may remain, and during a further forming or etching process further openings may be etched into the future lamella structure 14 before or after forming the support structure 30 in the first opening that remained while creating the cavity 16. Thus, the further openings may be filled by a further support structure material to form further support structures. Hence, all four support structures indicated in FIG. 6a may be formed during one deposition procedure before etching the circumferential trench 36.

Figure 6A:
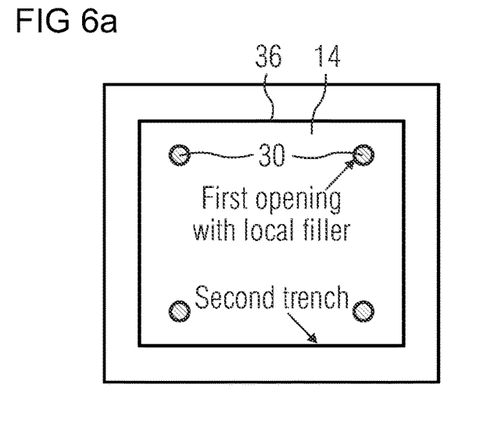
FIG. 6a-d show schematic top views of the semiconductor substrate material according to embodiments after processing using the method for forming the microelectromechanical device.
Figure 6B:
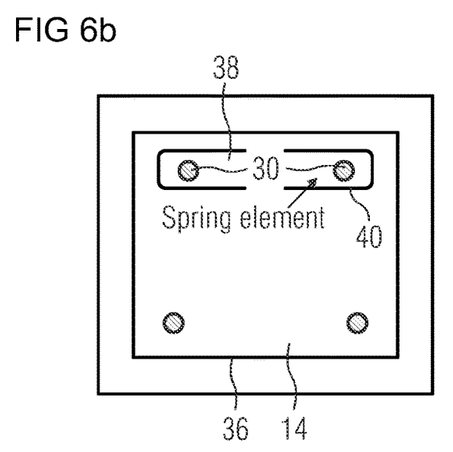

FIG. 6b indicates further embodiments of the present disclosure. After forming the support structure 30 and optionally before or after forming the circumferential trench 36, a spring element 38 may be formed in spatial proximity to the support structures 30. The spring element 38 may be a trench etched from the lamella structure 14 into cavity 16. Etching of the trench 40 may be performed for example using the same mask with a further pattern that is used to etch the circumferential trench 36, such that both trenches 36 and 40 are etched simultaneously. The trench 40 may partially enclose the support structures by, for example, at least 50%, at least 66%, or at least 75%, such that the lamella structure 14 is more easily displaceable with respect to the remaining semiconductor substrate material. However, there should still be a substantial connection between the support structure and the lamella structure 14, since otherwise the support structure 30 may not hold the lamella structure 14 spaced apart from the remaining semiconductor substrate material 2.

Figure 6C:
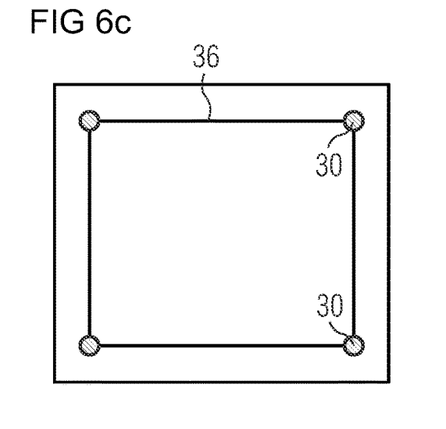

FIG. 6c shows a top view of the microelectromechanical device according to embodiments similar to the embodiments of FIG. 6a. However, the support structures 30 are located in the circumferential trench 36 such that a connection of the lamella structure 14 to the remaining semiconductor substrate material 2 at the main surface area 8 is achieved. According to embodiments, round openings might be formed in the corners where the support structures 30 are located and in a final step the circumferential trench 36 may be etched by connecting the support structures 30 by rectangular or long trenches. According to further embodiments, two (parallel) rectangular trenches may be formed and only partially filled at, for example, a beginning and an end point of the trench to form the support structure 30. In a further etching step, the circumferential trench 36 may be formed by connecting start and end points of the first trenches, i.e. the openings, by further, second (parallel) trenches to form the circumferential trench 36 by the first trenches and the second trenches.

Figure 6D:
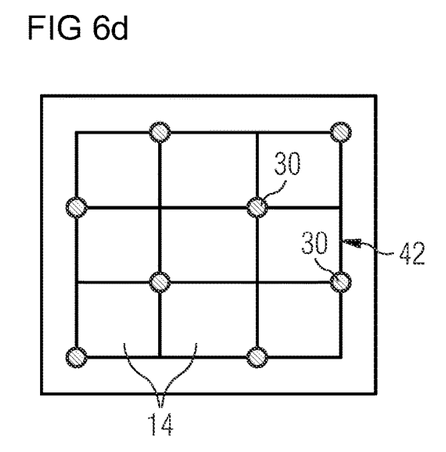

FIG. 6d shows a schematic top view of the microelectromechanical device according to further embodiments. Herein, multiple support structures 30 are indicated in a grid of trenches 42. Thus, multiple (in this case nine) lamella structures 14 may be formed having local circumferential trenches separating the single lamella structures 14 from the remaining semiconductor substrate material and additionally from the further lamella structures. The only connection between the different lamella structures may be common support structures 30 that may be connected to multiple, for example to two or to four different lamella structures 14. The grid of FIG. 6d shows nine different lamella structures 14 supported by eight separate support structures 30.

In a set of embodiments, the holes or openings are placed at various positions respective to the second trenches that may be the circumferential trench. Depending on mechanical needs (stability, pressure sensitivity), the field of openings may be of various density, in order to provide the desired properties. In some embodiments, the second trench is not filled. In this way, a free-hanging plate or lamella structure is provided. Other embodiments, such as an accelerometer structure or a resonator element may be formed. The main structuring element may be the local support of plate structures in combination with subsequent trench isolation of silicon sheets. The microelectromechanical device may be a gas sensor, an acceleration sensor, a MEMS resonator, or a power device with ultrathin active layers (lamella structures). The integration of these devices with ultrathin active layers may be improved by the present disclosure. According to embodiments, an improved structuring of local silicon-on-nothing elements with thermal/electrical isolation is shown. This structuring reduces the effort and cost compared to other procedures.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for forming a microelectromechanical device, the method comprising:
    forming a cavity in a semiconductor substrate material, wherein the semiconductor substrate material comprises an opening for providing access to the cavity through a main surface area of the semiconductor substrate material;
    forming a support structure having a support structure material different from the semiconductor substrate material to close the opening at least partially by mechanically connecting the main surface area of the semiconductor substrate material with a bottom of the cavity, the forming of the support structure including the support structure material directly contacting a bottom surface of the bottom of the cavity; and
    forming a lamella structure in the main surface area of the semiconductor substrate material above the cavity such that the lamella structure is held spaced apart from the bottom of the cavity by the support structure,
    wherein forming the lamella structure includes forming a circumferential trench in the main surface area of the semiconductor substrate material into the cavity after the support structure is formed.

2. The method according to claim 1, wherein the forming of the support structure comprises depositing the support structure material from the bottom of the cavity to the main surface area of the semiconductor substrate material.

3. The method according to claim 1, wherein the support structure material comprises an isolating material.

4. The method according to claim 1, wherein the forming of the support structure comprises a high density plasma oxide deposition.

5. The method according to claim 1, wherein the forming of the support structure comprises at least partially closing the opening such that at least a part of the cavity remains in the semiconductor substrate material.

6. The method according to claim 1, wherein the forming of the cavity comprises a silicon-on-nothing process or a Venezia process comprising forming small-scale openings in the semiconductor substrate material, connecting bottoms of the small-scale openings in the semiconductor substrate material to form the cavity, and closing the small-scale openings in the semiconductor substrate material above the cavity.

7. The method according to claim 6, further comprising:
    forming the opening with a greater size than the small-scale openings in the semiconductor substrate material during the silicon-on-nothing process or the Venezia process,
    wherein the opening remains open when the small-scale openings in the semiconductor substrate material are closed.

8. The method according to claim 1,
    wherein the circumferential trench encloses the support structure, and wherein the circumferential trench separates the lamella structure from the semiconductor substrate material at the main surface area of the semiconductor substrate material.

9. The method according to claim 1, wherein the opening is formed such that a cross sectional area of the opening is smaller than 10% of a cross-sectional area of the cavity.

10. A microelectromechanical device, comprising:
a semiconductor substrate material comprising a cavity, wherein the cavity is at least partially covered by a main surface area of the semiconductor substrate material;
a support structure of a support structure material different from the semiconductor substrate material to mechanically connect the main surface area of the semiconductor substrate material with a bottom of the cavity,
wherein the support structure material directly contacts a bottom surface of the bottom of the cavity; and
a lamella structure in the main surface area of the semiconductor substrate material above the cavity such that the lamella structure is held spaced apart from the bottom of the cavity by the support structure,
wherein the lamella structure includes a circumferential trench in the main surface area of the semiconductor substrate material into the cavity after the support structure is formed.

11. The microelectromechanical device of claim 10, wherein the bottom of the cavity defines a depth measured substantially perpendicular to the main surface area of the semiconductor substrate material.

12. The microelectromechanical device of claim 10, wherein the support structure includes the support structure material deposited from the bottom of the cavity to the main surface area of the semiconductor substrate material.

13. The microelectromechanical device of claim 10, wherein the support structure material comprises an isolating material.

14. The microelectromechanical device of claim 10, wherein the support structure material comprises a high density plasma oxide deposition.

15. The microelectromechanical device of claim 10, wherein the semiconductor substrate material comprises an opening for providing access to the cavity through a main surface area of the semiconductor substrate material, and
wherein the support structure is formed by at least partially closing the opening such that at least a part of the cavity remains in the semiconductor substrate material.

16. The microelectromechanical device according to claim 10,
wherein the circumferential trench encloses the support structure, and
wherein the circumferential trench separates the lamella structure from the semiconductor substrate material at the main surface area of the semiconductor substrate material.

17. The microelectromechanical device according to claim 15, wherein the opening is formed such that a cross sectional area of the opening is smaller than 10% of a cross-sectional area of the cavity.

* * * * *